United States Patent [19]

Hiraoka et al.

[11] Patent Number: 4,464,460
[45] Date of Patent: Aug. 7, 1984

[54] PROCESS FOR MAKING AN IMAGED OXYGEN-REACTIVE ION ETCH BARRIER

[75] Inventors: Hiroyuki Hiraoka, Saratoga; Donald C. Hofer, Morgan Hill; Robert D. Miller, San Jose; Lester A. Pederson, San Jose; Carlton G. Willson, San Jose, all of Calif.

[73] Assignee: International Business Machines Corporation, Armonk, N.Y.

[21] Appl. No.: 508,644

[22] Filed: Jun. 28, 1983

[51] Int. Cl.³ .............................................. G03C 5/00
[52] U.S. Cl. .................................... 430/323; 430/313; 430/314; 430/317; 430/316; 430/270; 430/272; 427/38; 156/643; 156/659.1; 156/668
[58] Field of Search .............. 430/322, 323, 312, 313, 430/314, 317, 270, 271, 303, 272, 316; 156/643, 652, 657, 659.1, 661.1, 668; 427/38

[56] References Cited

U.S. PATENT DOCUMENTS

| | | | |
|---|---|---|---|
| 3,615,538 | 10/1971 | Peters et al. | 430/272 X |
| 4,036,813 | 7/1977 | Hardman et al. | 528/22 |
| 4,356,246 | 10/1982 | Tabei et al. | 430/136 |

OTHER PUBLICATIONS

"Multi-Layer Resist Systems", B. J. Lin, Chapter in *Introduction to Microlithography*, Thompson, Willson & Bowden, Editors, American Chemical Society, (1982).

*Primary Examiner*—John E. Kittle
*Assistant Examiner*—José G. Dees
*Attorney, Agent, or Firm*—Joseph G. Walsh

[57] ABSTRACT

A process for making an image oxygen-reactive ion etch barrier using a polysilane that is resistant to resistive ion etching and is also a positive acting resist.

8 Claims, 2 Drawing Figures

PROCESS FOR MAKING AN IMAGED OXYGEN-REACTIVE ION ETCH BARRIER

DESCRIPTION

1. Technical Field

The present invention is concerned with a process for making an imaged oxygen-reactive ion etch barrier. The process involves the use of a soluble, castable polysilane.

2. Background Art

Multilayer resist schemes have the demonstrated ability to produce high resolution relief images over topographic features of the sort encountered in the fabrication of integrated circuit devices [B. J. Lin "Multilayer Resist Systems" Chapter in *Introduction to Microlithography*, L.F. Thompson, C. G. Willson and M. J. Bowden, Editors, American Chemical Society (1982)].

The implementation and effectiveness of multilayer resist schemes for generation of high aspect ratio high resolution relief images over topography depends on an effective and easy to use $O_2$-RIE barrier. This barrier layer must be resistant to $O_2$-RIE conditions and have properties compatible with the process and materials used in the first and third layers. Traditionally, materials such as spin-on glass and $Si_3N_4$ have been used as the $O_2$-RIE barrier. However, problems are encountered in the use of these materials. One standard material currently used, commercial "spin-on glass," is a silicate glass spun from solution. This solution has a short shelf life and aging leads to formation of particulate defects as large as 10 $\mu$m in the spin cast film. These defects severely impact the yield of the process. Another commercial process involves the use of plasma deposited Si or $Si_3N_4$. While this forms an effective $O_2$-RIE barrier, the thermal mismatch of the thin layers used often leads to cracking of the $Si_3N_4$, thereby resulting in defects (Ibid pp. 336). In addition, the achievement of good adhesion between the $Si_3N_4$ barrier layer and the top resist layer is difficult and generally requires the application of adhesion promotors, which involves additional processing steps and manufacturing cost.

DISCLOSURE OF THE INVENTION

We have now found a process for making an imaged oxygen-reactive ion etch barrier. The invention requires the use of only two layers, although it may also be modified to use with three-layered systems. The invention uses a barrier layer which is a soluble, castable polysilane. A preferred polysilane is the 1:1 copolymer derived by the co-polymerization of dichlorodimethylsilane and dichlorophenylmethylsilane. Another preferred polysilane is poly(phenylmethylsilane). Still another preferred polysilane is poly(cyclohexyl methyl silane). The polysilanes have excellent RIE resistance because exposure to an $O_2$ plasma results in formation of a film of $SiO_2$ on the surface of the polysilane layer. Adhesion of these materials both to silicon and to organic materials is excellent. It should be noted that use of the polysilanes as barrier materials provides excellent adhesion to an overcoat resist, because these layers slightly admix with the polysilane. It should also be noted that no surface preparation is required for use of these materials.

The polysilanes useful in the present invention have a molecular weight ($\overline{M}w$) of above 4,000, and a glass transition temperature above 100° C.

BRIEF DESCRIPTION OF THE DRAWINGS

The drawings are diagrammatic, and not to scale.

Turning to FIG. 1, step 1 shows a substrate (4) which is typically silicon, that is coated with a trilevel resist structure. The layer (1) closest to the substrate is a planarizing polymer layer. This layer is usually about 1–5 $\mu$m thick. In the present invention, layer (2), the intermediate or barrier layer, is a soluble, castable polysilane. This use of a polysilane barrier layer is novel. Layer (1) must be insoluble in the solvent used to cast layer (2). Layer (2) should preferably be about 0.1 to 0.5 $\mu$m thick. Layer (3) is a lithographic resist layer and is thick enough to insure acceptable defect density which will provide fidelity in a subsequent image transfer step.

Figure 1:
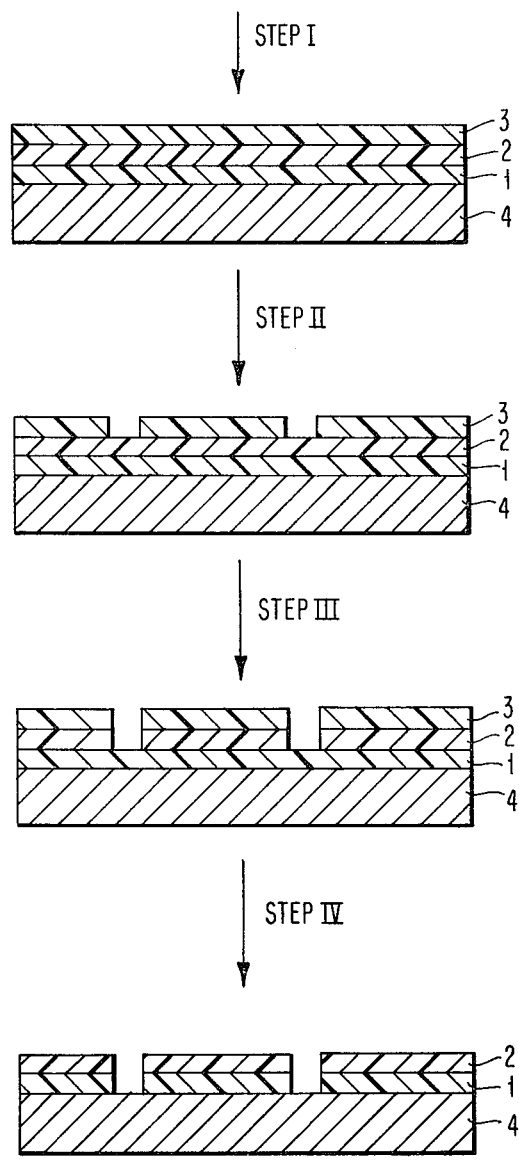
FIG. 1 is a flow chart showing the steps of a trilevel system used in the prior art. The present invention can be used in this trilevel mode, but a two-level mode is preferred.

In Step II, layer (3) is imaged in the usual fashion to expose selected areas of the barrier layer (2).

In Step III $CF_4$-$O_2$ etching is used to transfer the resist image through the barrier layer (2).

In Step IV, anisotropic $O_2$-RIE is used to transfer the image in the barrier image layer (2) through the polymer layer (1). The result is a template having high aspect ratio and high resolution.

Layer (3), the lithographic resist layer, may be any of very many such materials known in the art. It may be either a positive resist or a negative resist, and may be sensitive to electron beam, X-ray, ion beam or ultra violet exposure.

Examples of useful resists include novolac sensitized with diazoquinones, novolac sensitized with a poly(sulfone), and poly(methyl methacrylate) and analogues thereof.

Preferred solvents for use in casting the polysilane layer (2) include, for example, toluene, xylene and other hydrocarbons and mixtures thereof.

Layer (1), the planarizing polymer layer, may be any of a large number of polymers well known in the art. It must be insoluble in the solvent chosen to cast the polysilane layer (2). Typical useful polymers include hard baked diazoquinone novolacs, and cross-linked bisazide-rubber resist formulations.

Synthesis of one of the preferred polysilanes is accomplished as follows:

Into a flask equipped with a mechanical stirrer, addition funnel inlet and reflux condenser was added 650 ml of dry toluene and 2.0 mol of the freshly distilled phenylmethyldichlorosilane. The mixture was heated to reflux and 2.1 mol of sodium dispersion (39.3% in mineral spirits) was slowly added through the addition funnel maintaining the reflux. After the addition, the mixture was refluxed for one hour and cooled to 25° C. The excess sodium was decomposed with 400 ml of a 1:1 isopropanol ethanol mixture. After adding 8 ml of water, the reaction mixture was poured into 5 L of isopropanol, and the precipitated polymer was filtered and air dried. The polymer was redissolved in ~1 L of toluene which was washed 10 times with water to remove any salts. The toluene was dried over sodium sulfate and the solvent removed on the rotary evaporator. The polymeric residue was dried in a vacuum oven for 15 hours at 86° C. (66.5 g, 55.1%). Other polysilanes useful in the present invention can be made by similar methods.

In a typical application of the invention, trilevel lithographic structures were fabricated by: (1) spin application of 2 μm thick novolac resist and 200° C. baking for one hour; (2) spin application of a 0.25 μm thick film of poly(phenylmethyl silane) from a 6 wt % solution in oxylene, and baking for 20 minutes at 125° C.; (3) spin application of a 0.50 μm film of AZ2400 resist. (AZ2400 is a commercial diazoquinone-novolac type resist available from Shipley Corporation.) The AZ2400 resist was exposed to a dose of 100 mJ/cm$^2$ at 404 nm using a high pressure Hg lamp and optical bandpass filter. The AZ2400 resist image was developed in 5/1 dilution of H$_2$O/AZ2401 developer for four minutes. (AZ2401 is a commercially available developing solution available from said Shipley Corporation.) The image transfer to the polysilane was performed by CF$_4$-O$_2$ Reactive Ion Etching (RIE) using a Tegal Plasmaline 100 RIE tool operating with 200 watts power, 20 SCCM CF$_4$ flow, and 140 m Torr pressure. The etch rate was 1000 angstroms per minute and total etch time was three minutes. Final transfer of the image in the polysilane to novolac resist was performed with O$_2$-RIE, O$_2$ flow, (25 CFM), 100 watts power, and 140 m Torr pressure.

Figure 2:
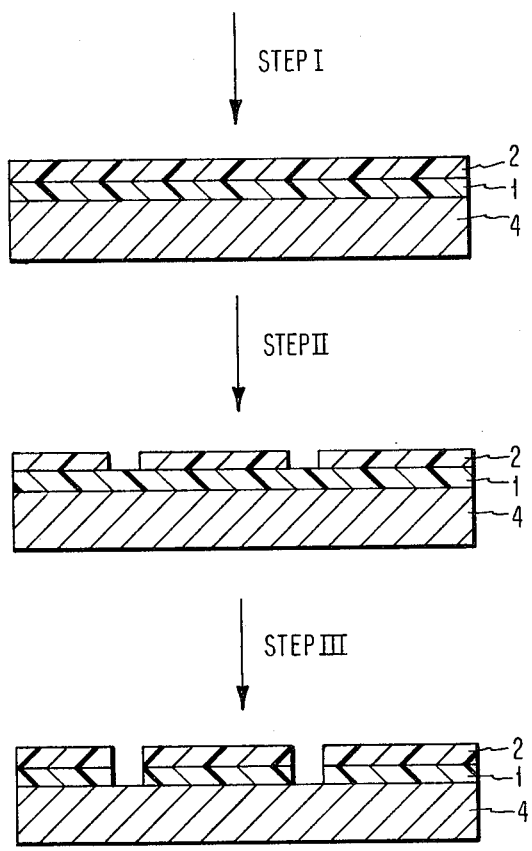
FIG. 2 is a flow chart showing the steps of the two level system made possible by the present invention. This two-level system will be discussed later.

The most preferred embodiment of the present invention employs a bilayer system instead of the conventional trilevel system, and a critical feature of the invention is that the soluble, castable polysilane is not only an efficient O$_2$-RIE etch barrier, but a positive resist as well. Understanding of this simplified process will be facilitated by reference to FIG. 2. In Step I, a substrate (4) which is typically silicon is coated sequencially with a polymer (1) and then a soluble, castable polysilane (2). In Step II the polysilane layer (1) is imagewise exposed and developed to expose selected areas of polymer 1. In Step III anisotropic O$_2$-RIE is used to transfer the polysilane resist image through the polymer layer (1) to expose selected areas of the substrate (4). The result is the same high resolution, high aspect ratio image as that generated in the more complex process detailed in FIG. 1. We know of no materials other than the polysilanes that are both positive resists and useful O$_2$-RIE barriers.

The two level system is best used with exposure of the silane at wavelengths less than 375 nm. In order to achieve comparable structures using exposure equipment that utilizes longer wavelength light, the trilayer scheme can be employed.

In a typical application of the invention, bilevel structures were fabricated by (1) spin application of 2 μm thick novolac-type resist and baking at 200° C. for one hour; (2) spin application of 0.25 μm thick film of poly(cyclohexyl methyl silane) from a 6 wt. % solution in xylene and baking for 20 minutes at 125° C. The film was exposed on a Perkin Elmer Micraline 500 in the UV-3 mode at scan speed 9000, aperture setting #2. Development was accomplished in isopropyl alcohol at room temperature. Image transfer was accomplished in a Tegal Plasmaline 100 RIE tool in O$_2$ at 20 SCCM, 100 watts and 140 m Torr. The resulting structures provided minimum images of less than one micron linewidth.

We claim:

1. A process for making an imaged oxygen-reactive ion etch barrier, said process being characterized by the steps of
   (1) coating a substrate with a polymer layer;
   (2) dissolving a polysilane having a molecular weight ($\overline{M}w$) above 4,000 and a glass transition temperature above 100° C. in an organic solvent in which said polymer layer is insoluble;
   (3) coating said dissolved polysilane as a film on the polymer coated substrate;
   (4) exposing said polysilane film in an imagewise manner to radiation;
   (5) developing the polysilane film by contacting it with a solvent to dissolve the areas which have been exposed to radiation and thereby uncover portions of the polymer layer; and
   (6) exposing the system to anisotropic oxygen-reactive ion etching to uncover portions of the substrate and thereby generate a high resolution, high aspect ratio relief structure.

2. A process for making an images oxygen-reactive ion etch barrier, said process being characterized by the steps of:
   (1) coating a substrate successively with first a polymer layer, secondly a layer of polysilane having a molecular weight ($\overline{M}w$) above 4,000 and a glass transition temperature above 100° C. and cast from a solvent in which said polymer layer is insoluble, and thirdly with a lithographic resist layer;
   (2) imagewise exposing and then developing the resist layer to form relief images that uncover portions of the polysilane layer;
   (3) exposing the uncovered portions of the polysilane layer to CF$_4$-O$_2$ etching and thereby uncovering portions of the polymer layer; and
   (4) exposing the system to anisotropic oxygen reactive ion etching to uncover portions of the substrate, and thereby generate a high resolution, high aspect ratio relief structure.

3. A process as claimed in claim 1 wherein the polysilane is poly(phenyl methyl silane).

4. A process as claimed in claim 1 wherein the polysilane is a 1:1 copolymer of dichlorodimethylsilane and dichlorophenylmethylsilane.

5. A process as claimed in claim 1 wherein the polysilane is poly(cyclohexyl methyl silane).

6. A process as claimed in claim 2 wherein the polysilane is poly(phenyl methyl silane).

7. A process as claimed in claim 2 wherein the polysilane is a 1:1 copolymer of dichlorodimethylsilane and dichlorophenylmethylsilane.

8. A process as claimed in claim 2 wherein the polysilane is poly(cyclohexyl methyl silane).

* * * * *